(12) United States Patent
Paul

(10) Patent No.: US 6,628,120 B1
(45) Date of Patent: Sep. 30, 2003

(54) VOLTAGE MEASURING CIRCUIT AND VOLTAGE SUPPLY CIRCUIT OF AN INTEGRATED FUEL CELL SYSTEM

(75) Inventor: Steffen Paul, Munich (DE)

(73) Assignee: Ballard Power Systems AG, Kirchheim-Nabern (DE)

( * ) Notice: Subject to any disclaimer, the term of this patent is extended or adjusted under 35 U.S.C. 154(b) by 0 days.

(21) Appl. No.: 09/720,365

(22) PCT Filed: May 21, 1999

(86) PCT No.: PCT/EP99/03492

§ 371 (c)(1),
(2), (4) Date: Jun. 11, 2001

(87) PCT Pub. No.: WO99/67654

PCT Pub. Date: Dec. 29, 1999

(30) Foreign Application Priority Data

Jun. 23, 1998 (DE) .......................................... 198 27 878

(51) Int. Cl.⁷ ............................................. G01N 27/416
(52) U.S. Cl. ........................ 324/429; 324/434; 320/101
(58) Field of Search ................................ 324/429, 426, 324/425, 433, 434; 320/134, 136, 162, 101

(56) References Cited

U.S. PATENT DOCUMENTS

| | | | |
|---|---|---|---|
| 3,997,888 A | | 12/1976 | Kremer .................... 340/249 |
| 4,198,597 A | * | 4/1980 | Sawyer ..................... 324/434 |
| 5,460,901 A | | 10/1995 | Syrjälä ...................... 429/90 |
| 5,546,003 A | * | 8/1996 | Noworolski et al. ........ 324/434 |
| 5,652,501 A | * | 7/1997 | McClure et al. ........... 340/636 |
| 5,677,613 A | * | 10/1997 | Perelle ..................... 320/122 |
| 5,763,113 A | * | 6/1998 | Meltser et al. ............. 429/13 |
| 5,910,723 A | * | 6/1999 | Perelle ..................... 320/119 |
| 6,020,718 A | * | 2/2000 | Ozawa et al. .............. 320/116 |
| 2002/0053896 A1 | * | 5/2002 | Adams et al. ............. 320/121 |

FOREIGN PATENT DOCUMENTS

GB        2 051 382 A        4/1980

* cited by examiner

*Primary Examiner*—Gregory J. Toatley, Jr.
(74) *Attorney, Agent, or Firm*—Seed IP Law Group PLLC

(57) ABSTRACT

In a voltage measuring circuit for a composite fuel cell system, the potential of at least one point of the composite fuel cell system is detected by tapping the potential of such point, and feeding it to an input of an arrangement for evaluating the voltage. A potential shifting element is interposed between the at least one point of the composite fuel cell system and the input of the arrangement, which element is connected in series with a current sink or current source. A voltage supply circuit for such voltage measuring circuit of a composite fuel cell system comprising a plurality of individual fuel cells connected in series includes at least one voltage stabilization element connected in parallel with the circuit which is to be supplied with voltage by the composite fuel cell system. At least one current source or current sink is connected in series with this parallel circuit.

8 Claims, 8 Drawing Sheets

VOLTAGE MEASURING CIRCUIT AND VOLTAGE SUPPLY CIRCUIT OF AN INTEGRATED FUEL CELL SYSTEM

BACKGROUND AND SUMMARY OF THE INVENTION

This application claims the priority of German patent document 198 27 878.0, filed Jun. 23, 1998 and PCT International Application No. PCT/EP99/03492, filed May 21, 1999, the disclosures of which is expressly incorporated by reference herein.

The present invention relates to a circuit for measuring the voltage output from a composite fuel cell system.

An $H_2/O_2$ composite fuel cell system comprises a series circuit formed by a plurality of individual fuel cells—typically on the order of 100. Each of these individual fuel cells supplies the rated current $I_N$ of the composite fuel cell system; and the sum of the voltages of the individual fuel cells produces the rated voltage $U_N$ of the composite fuel cell system, which can be tapped off as the total voltage at the terminals of the first and last individual fuel cells of the composite fuel cell system. Intermediate voltages can be obtained by mounting additional terminals mounted between the individual fuel cells.

Electrical circuits requiring an electrical energy supply are used for monitoring individual fuel cells, and for other control tasks. Such energy can be supplied by means of an external battery in the known prior art. If on the other hand, energy is intended to be supplied to the circuit from the composite fuel cell system itself, then this depends on the function of the circuit. That is, if it processes signals which do not originate directly from the fuel cell, then this energy can be obtained from the total output of the composite fuel cell system. By contrast, if signals of the composite fuel cell system are used directly, then it is not possible to supply current to the circuits without additional circuitry, owing to the necessary potential isolations. The signals of the composite fuel cell system may be, for example, the voltages of the individual fuel cells; in this manner it is possible to implement suitable measures in the event of a defect in individual cells, which is manifested in a significant change in their voltage.

In the case of a voltage supply from the composite fuel cell system, the measurement of the voltages of the individual fuel cells requires either a measuring device with ground-free input or a high permissible input voltage range.

The supply voltages of electrical circuits are typically of an order of magnitude of 5 to 15 V, with both negative and positive supply voltages being required for operational amplifiers, for example. Depending on the type of operational amplifier, it is also possible to work only with positive supply voltages (e.g. LM324).

If the composite fuel cell system is intended to be used for supplying voltage to the circuit, then problems arise. The input signal (in other words the measurement signal), which is at the potential $\phi_a$ relative to a reference signal $\phi_c$, depends on the individual fuel cell to be measured. Particularly when processing cell signals of the upper cells, the input must then be especially voltage-stable in order e.g. to process a difference signal. The interaction of measurement signal, electrical protective circuit and its current supply turns out to be difficult, which is why the circuitry required for this purpose is complicated.

By way of example, if a subtracting amplifier is used, it is necessary to choose an operational amplifier which allows input voltages up to the total voltage of the composite fuel cell system (that is, approximately 200 V), and also additional overvoltage protection, even if the voltage to be measured is only in the vicinity of the supply voltage. However, the maximum actual input voltage is typically in the vicinity of the supply voltage of the amplifier (that is, approximately 15 V). Furthermore, it is another disadvantage that the amplifier operates at its drive-level limit in the case of this voltage supply from the composite fuel cell system in the event of driving with signals from the fuel cells in the edge region of the composite fuel cell system.

It is apparent from the above, therefore, that, to measure the potentials at individual terminals of the composite fuel cell system, it is necessary to use a measuring device which is either provided with a ground-free input or in which the permissible input voltage is at least the total voltage of the composite fuel cell system.

Furthermore, British patent document GB-A-2051382 discloses measuring the voltage of a battery by using a diode (or a zener diode) to obtain a reference voltage from the voltage to be measured; the reference voltage remains at least virtually constant, even if there is a drop in the battery voltage to be measured. The battery reference voltage thus obtained is at a lower level than the voltage to be measured. In parallel with this circuit in which the reference voltage is obtained, the voltage to be measured is shifted so that when a specific voltage level of the battery is undershot, the sign of the difference between the shifted voltage and the reference voltage changes. The fact that a specific voltage level of the battery has been undershot can be derived from the change in sign of this difference.

U.S. Pat. No. 3,997,888 discloses a circuit which is supplied with a stabilized voltage from a battery by a series circuit of a zener diode with a resistor connected in parallel therewith.

One object of the present invention is to provide simplified circuit arrangement of the type described above.

This and other objects and advantages are achieved by the measurement circuit according to the invention, in which a potential shifting element is interposed between the particular point of the composite fuel cell system and the input of the arrangement. The shifting element is connected in series with a current sink or current source, and potential shifting by the potential shifting element is dependent on the potential of the particular point relative to a reference point of the composite fuel cell system, given a proper state of the individual cells of the composite fuel cell system.

This makes it possible also to evaluate voltage signals from individual fuel cells which are situated at the edge of the composite fuel cell system.

The potential can then advantageously be adapted to an input voltage range.

In one embodiment of the invention, the voltage difference between two points within the composite fuel cell system is detected by tapping the potentials of the two points and feeding them to an arrangement for evaluating the voltage difference. Respective potential shifting elements are interposed between both points of the composite fuel cell system and the inputs of the arrangement, and each such element is also connected in series with a current sink or current source.

As a result, the voltage of an individual fuel cell can be detected as a voltage difference in a simple manner; for example, by shifting the two potentials by the same amount. This makes it possible to evaluate voltages of individual fuel cells which are situated at the extremities of the composite fuel cell system. The shifting of the potentials of the two points by the same amount may be performed, for example, by the respective potential shifting elements.

As a result, the voltage difference between the "shifted" potentials and the "unshifted" potentials is identical, so that no further outlay need be expended in order to take account of the potential shift when evaluating the voltage.

In another embodiment of the invention, the voltage measuring circuit comprises one or more integrated circuits, which achieves a cost advantage, particularly in large numbers.

In still another embodiment, at least one voltage stabilization element is connected in parallel with the voltage measuring circuit, and at least one current source or current sink is connected in series with this parallel circuit.

One advantage of this arrangement is that it is possible to supply voltage to an amplifier with positive and negative supply voltage, while at the same time it is also possible to generate a virtual ground that it is adjustable as desired. Current is supplied from part of the total voltage of the composite fuel cell system. This means, in particular, that no additional auxiliary source is required.

Other objects, advantages and novel features of the present invention will become apparent from the following detailed description of the invention when considered in conjunction with the accompanying drawings.

DETAILED DESCRIPTION OF THE DRAWINGS

In a voltage supply for an amplifier arrangement V with positive and negative supply voltage, the amplifier arrangement V is fed from two current sources with approximately identical impressed current $I_{Q1}$, $I_{Q2}$. The impressed current is split into a first component which flows through the amplifier and a second component that flows through a parallel connected voltage stabilization element, which may be, for example, a reverse biased zener diode arrangement. The voltage drop across the amplifier arrangement V turns out to be $U_{Z1}+U_{Z2}$, for example, when two series-connected zener diodes are used, which ensure a constant voltage drop across the amplifier arrangement V. The individual zener voltages each correspond to the supply voltage.

It is assumed here that the amplifier arrangement requires positive and negative supply voltages of the same magnitude. The ground terminal of the amplifier lies between these two potentials. In order to be able to electrically connect it, a potential between the positive and negative supply voltages is necessary. The voltage stabilization element ensures a constant sum of the magnitudes of the positive and negative supply voltages at the amplifier. By using two zener diodes, the connecting node between these diodes can be used as an intermediate potential.

In principle, the voltage stabilization can also be effected by a resistor arrangement (in parallel with $R_P$) which has a central tap.

Figure 1:
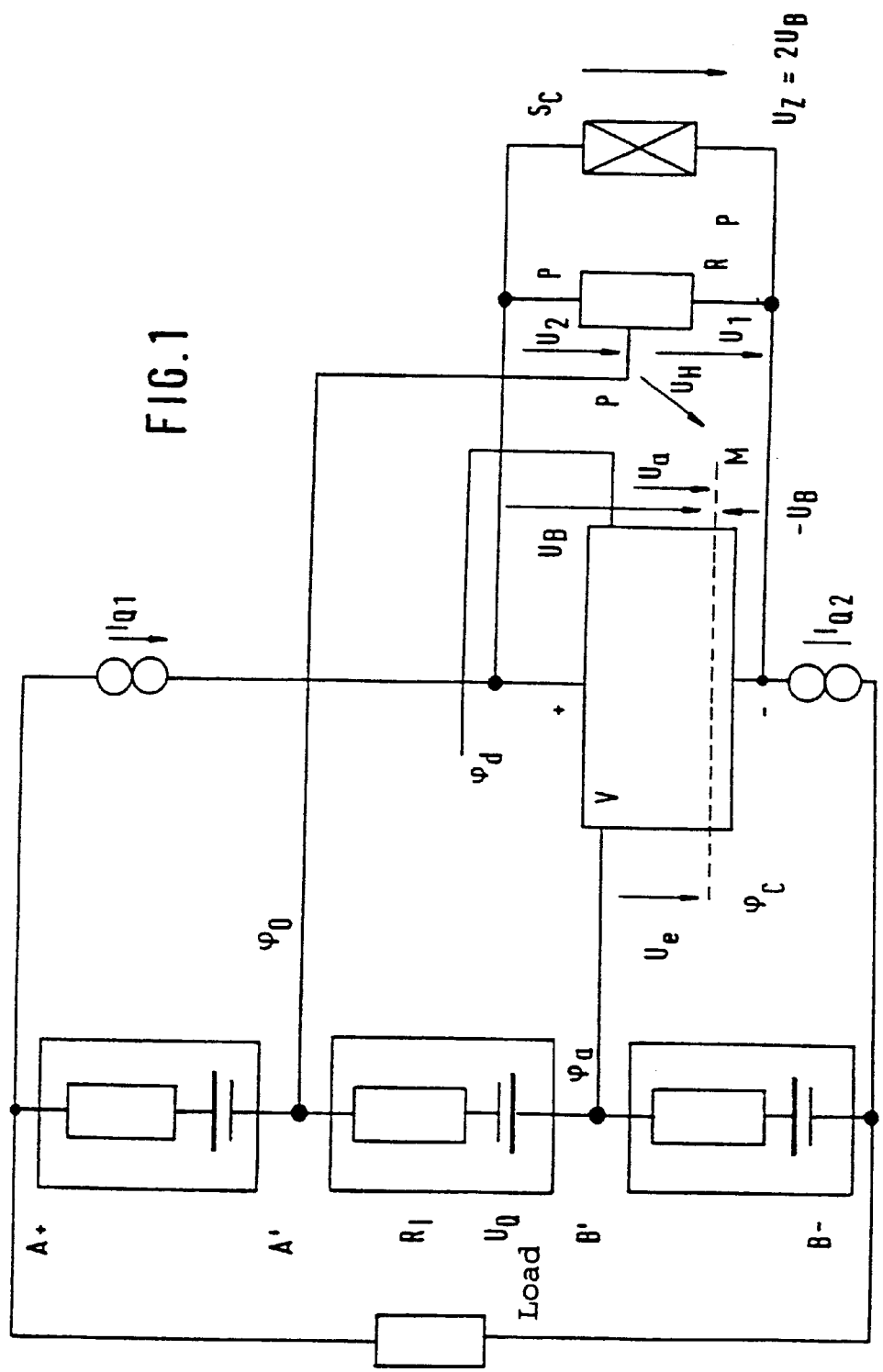
FIG. 1 shows an embodiment of a circuit arrangement for supplying voltage to an amplifier arrangement.

The point M illustrated in FIG. 1 (and also in FIG. 3) is connected to the center of the voltage stabilization element.

The current consumption of the amplifier arrangement V is approximately constant, with the impressed current dimensioned so that fluctuations in the supply voltage do not lead to changes in the stabilized voltage $U_{Z1}+U_{Z2}$. This is achieved by setting the current through the zener diodes in such a way that a zener current still flows at the lowest permissible voltage of the composite fuel cell system, so that the zener voltages produce the supply voltages of the amplifier. The supply voltages are set by choosing suitable zener diodes with corresponding zener voltages.

While it is always possible to supply current to the amplifier arrangement V by means of current sources from the composite fuel cell system when the measurement signals are tapped off approximately in the central part of the composite fuel cell system, problems can arise in the case of outer cells (at the extremities of the composite fuel cell system) because a sufficient voltage drop may no longer available for one of the two current sources.

Figure 2:
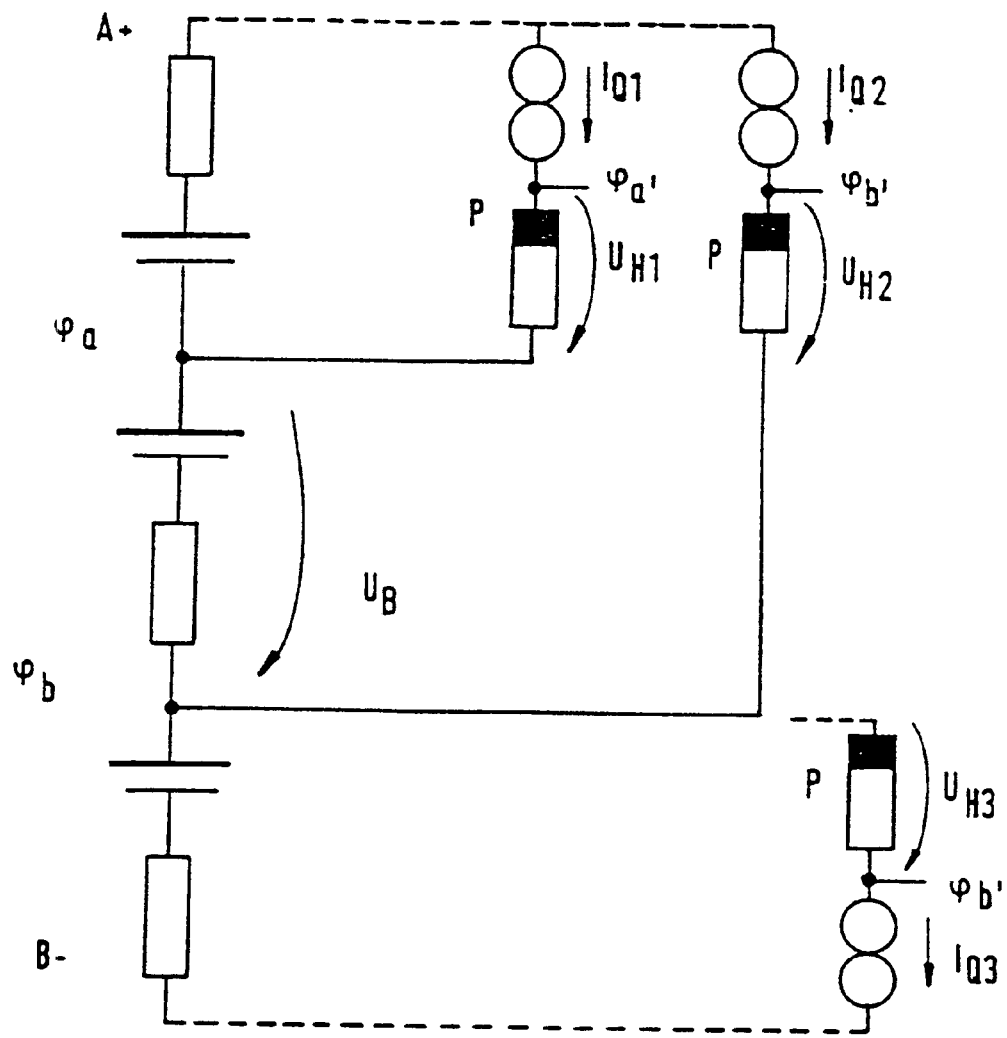
FIG. 2 shows a potential shifting arrangement for the purpose of voltage measurement.

FIG. 2 shows a basic illustration of the conditions when a potential shift is performed for the purpose of measuring a potential. The respective potential of the individual fuel cells $\phi_a$ and $(\phi_b$ is shifted by a potential shifting circuit, comprising the series circuit of a current source $I_Q$ and a potential shifting element P across which a voltage $U_H$ is dropped, to any desired value $\phi_a'$, $\phi_b'$:

$$\phi_a'=\phi_a+U_{H1}, \phi_b'=\phi_b+U_{H2}.$$

The potential shifting circuit is fed either from the dedicated circuit or by means of an external battery. If the potential shifting circuit is fed from the dedicated circuit, $\phi_a'$ and $\phi_b'$ are limited by the highest potential of the composite fuel cell system. If the potential shifting circuit is supplied by an external battery, such limitation is obviated.

In addition to the current source circuit ($I_{Q1}$, $I_{Q2}$) illustrated in FIG. 2, an analogous current sink circuit ($I_{Q3}$) is also possible. In this case:

$$\phi_b'=\phi_b-U_{H3}.$$

By virtue of the potential shifting circuits in a current-source or current-sink embodiment, the potentials of intervening fuel cells of a composite fuel cell system can conveniently be shifted to values which are adapted to the requirements of an electrical measuring or protective circuit. In particular, the potential difference which is important for indicating the state of individual fuel cells is produced:

$$\phi_a'-\phi_b'=U_{H1}-U_{H2}+\phi_a-\phi_b=U_{H1}-U_{H2}+U_B.$$

In the case of $U_{H1}$, $U_{H2}$, the following results from this:

$$\phi_a'-\phi_b'=U_B.$$

Therefore, given identical shift voltages $U_{H1}$, $U_{H2}$, the measurement signal is available without having been corrupted.

Figure 3:
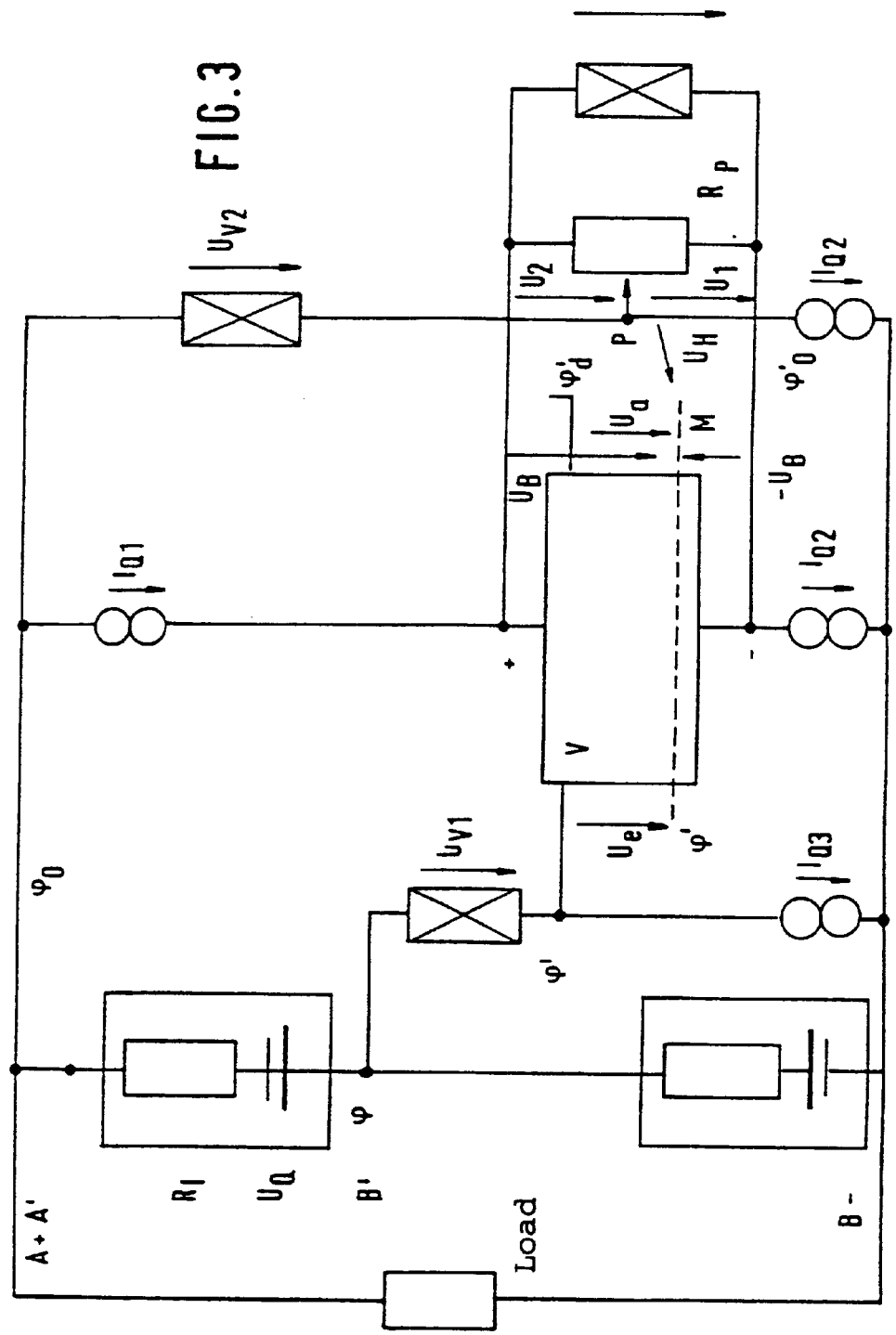
FIG. 3 shows another embodiment of a circuit arrangement for voltage measurement.

FIG. 3 shows a circuit arrangement similar to that of FIG. 1, in which potential shifting is performed. By virtue of the potential shifting, the potential $\phi_a$ of the battery pole B', which supplies the measurement signal, is shifted by the voltage $U_{V1}$ to $$\phi_a'=\phi_a-U_{V1}$$

by a potential shifting circuit ($U_{V1}$, $I_{Q3}$). In addition, the potential at the output ground point P is similarly shifted to $$\phi_0'=\phi_0-U_{V2}$$

by the potential shifting circuit $U_{V2}$, $I_{Q4}$ between the points A+, B− of the composite fuel cell system.

The virtual ground M then has the potential $$\phi_C=\phi_0'-U_H \text{ (where } U_H=2*U_B-U_2\text{).}$$

The auxiliary voltage can additionally be modified by $U_{V1}$ or $U_{V2}$.

In the circuit arrangement according to FIG. 1, the potential shifting element $R_P$ can be used for changing the input voltage (or output voltage) of the amplifier. This function is performed by $U_{V1}$, $I_{Q3}$ in FIG. 3. With the terminal P, it is now possible here to use a different output signal as U, for example $\phi_d'-\phi_0$. As a result, both the input voltage and the output voltage can be shifted independently of one another.

As the current source or current sink $I_Q$, various embodiments are suitable in conjunction with the respective positive or negative pole (A+, B−) of the composite fuel cell system, which embodiments will be explained below.

The first exemplary embodiment that will be mentioned is the non-reactive series resistor, which has not been illustrated in a separate figure.

Figure 4:
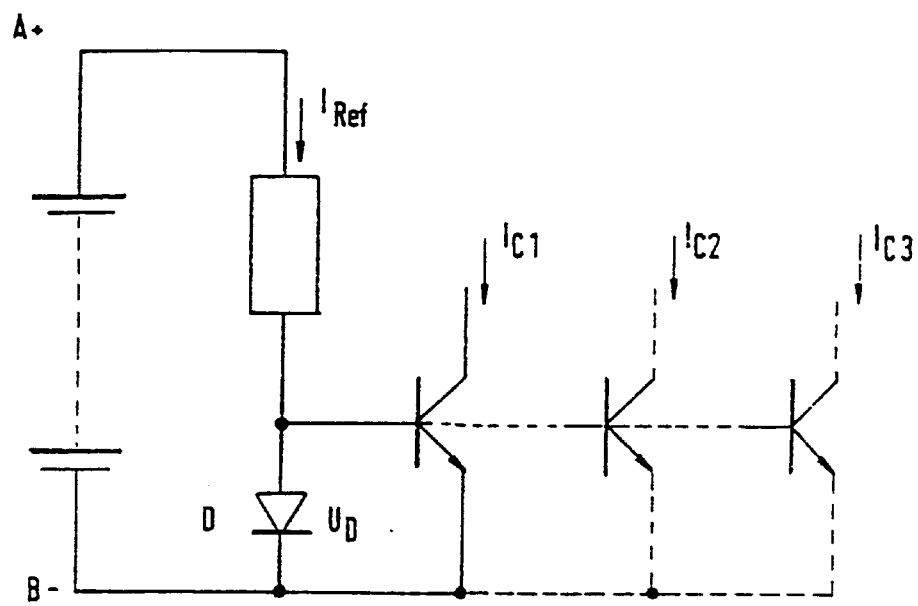
FIGS. 4–9 show embodiments of the current sources.

In FIG. 4, a bipolar transistor is shown as an exemplary embodiment of a current source. The bipolar transistor is controlled, in particular, by a relatively constant diode voltage. A reference current $I_{Ref}$ is obtained at the node A+ and generates a diode voltage $U_D$. The latter generates the transistor collector current:

$$I_C=k*I_{Ref}=\text{const.}$$

The constant k depends on the transistor dimensioning and can largely be influenced. A reference diode D can control a plurality of current source transistors, thereby producing a current bank, as is illustrated by broken lines in FIG. 4. Instead of a diode, it is also possible to use an npn or a pnp transistor in which collector-base or emitter-base, respectively, are short-circuited.

Figure 5:
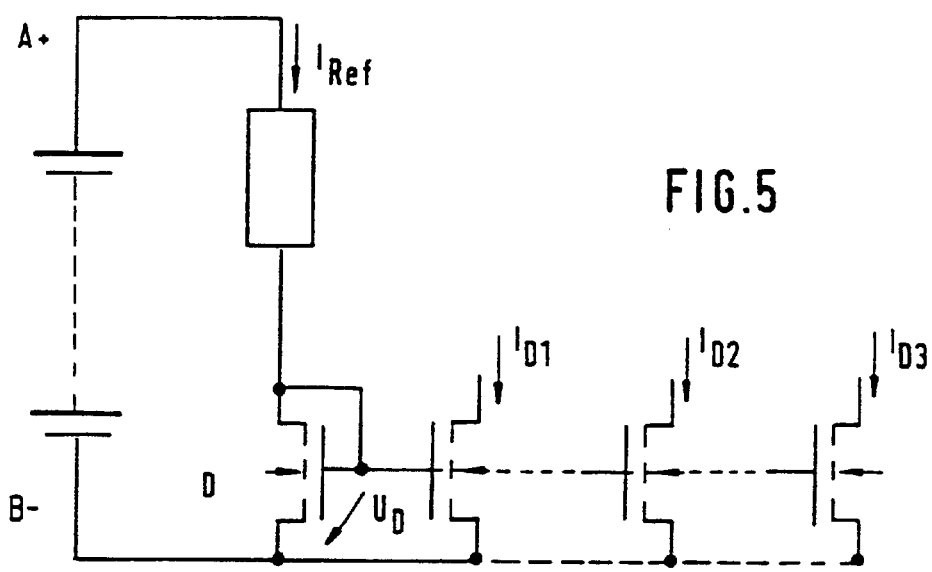

FIG. 5 shows an exemplary embodiment using a MOS field-effect transistor. In this case, a reference current $I_{ref}$ generates a diode voltage $U_D$ at a gate-source junction— acting as a field-effect diode D—of an enhancement-mode MOSFET. The diode voltage controls an n-channel enhancement-mode MOSFET into the saturation region, and the drain-gate junction of the MOSFET is short-circuited. Therefore, following holds true:

$$I_D=k*I_{Ref}=\text{const.}$$

The constant k depends on the transistor dimensioning and can largely be influenced. A reference diode D can control a plurality of current source transistors ($I_{D1}$, $I_{D2}$, ... as current bank).

Figure 6:
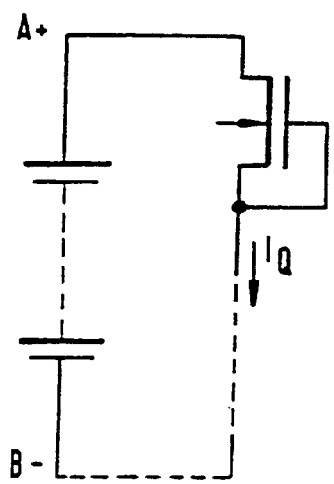

FIG. 6 shows an exemplary embodiment using a depletion-mode field-effect transistor, which may be either of the MOS or junction field-effect type. Due to a short circuit between gate and source, the arrangement acts as a current source above the so-called compliance voltage. The n-channel transistor is connected by its drain terminal to the point A+(+$U_B$) of the composite fuel cell system. The magnitude of the source current $I_Q$ is determined by the transistor. This source current $I_Q$ can be varied within certain limits for example by connecting a plurality of transistors in parallel.

Figure 7:
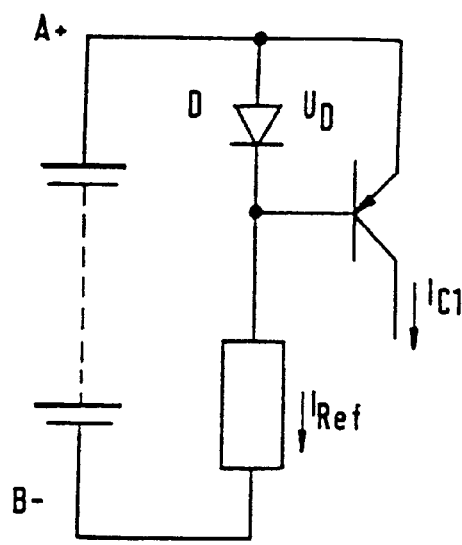
Figure 8:
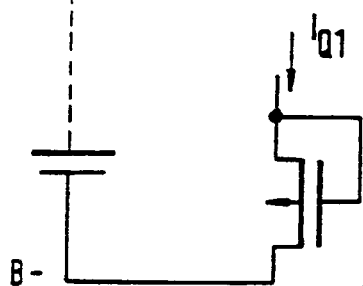
Figure 9:
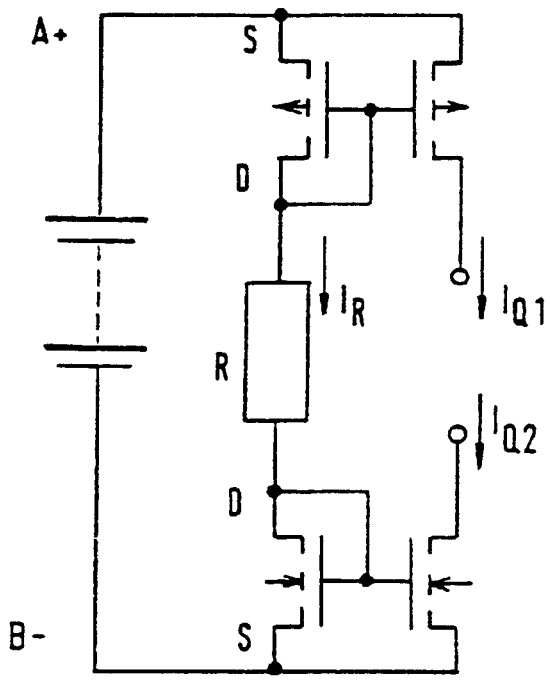

FIGS. 7 to 9 show the complementary forms of the exemplary embodiments shown in FIGS. 4 to 6.

FIG. 7 shows the corresponding illustration using a bipolar transistor, and FIG. 8 using a depletion-mode field-effect transistor (p-channel depletion-mode MOSFET).

Combinations of complementary current mirrors as shown in the illustration of FIG. 9 prove to be particularly expedient. In this case, the current source can be realized as the collector-emitter path of a bipolar transistor whose current source current is set by an auxiliary current (reference current $I_R$), which generates a forward voltage at a forward-biased auxiliary diode. The forward voltage simultaneously controls the base-emitter junction.

Furthermore, the current source can be realized as the drain-source path of a MOSFET enhancement-mode transistor whose source current is set by an auxiliary current (reference current $I_R$), which generates a forward voltage at a forward-biased field-effect diode (drain-source path of a MOS enhancement-mode transistor with direct drain-gate connection). The forward voltage simultaneously controls the gate-source junction of the current source transistor.

The embodiments of the circuit as a "current bank" are particularly suitable for implementation in integrated circuit form.

Figure 10:
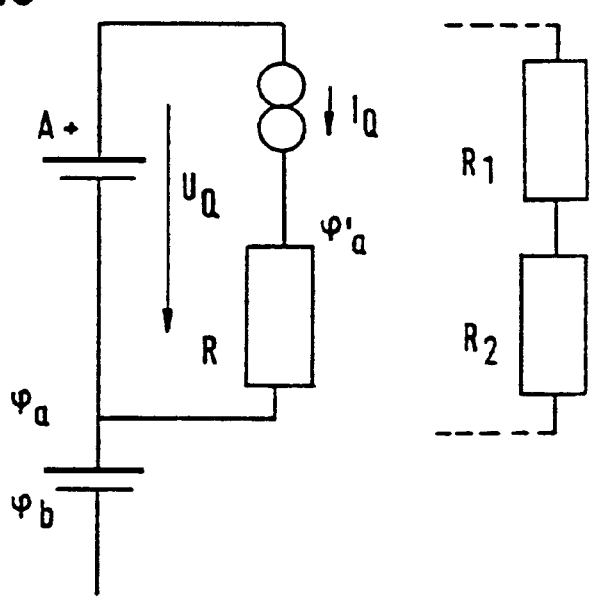
FIGS. 10–14 show embodiments of the potential shifting elements.

FIG. 10 shows an exemplary embodiment of a potential shifting element which is formed by a non-reactive resistor. The following holds true:

$$\phi_a'=\phi_a+I_Q*R.$$

The shift voltage depends on $I_Q$ and R and can be set within wide limits. A special case of this is the resistive voltage divider. In this case, the following holds true:

$$\phi_a'=\phi_a+k*U_Q.$$

The voltage divider ratio k is adjustable.

Figure 11:
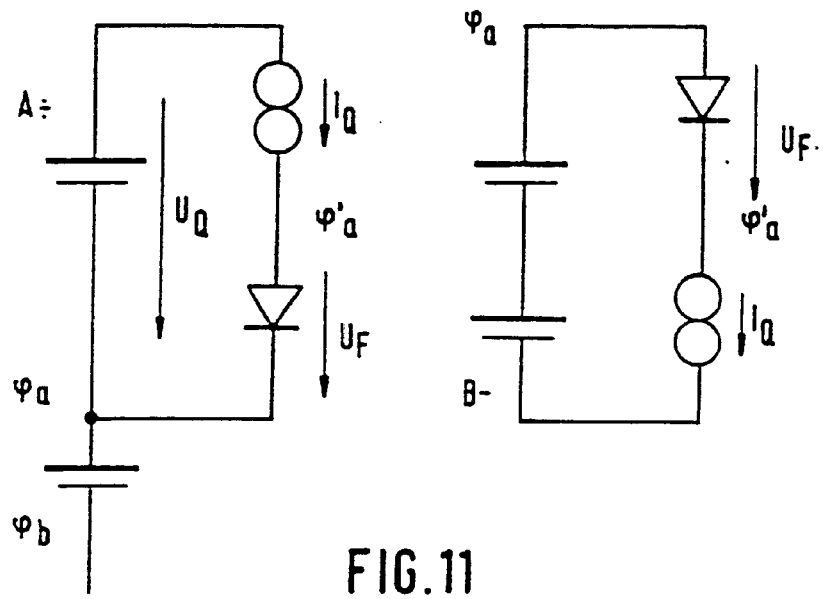

FIG. 11 shows a further exemplary embodiment of a potential shifting element which is formed by one or more series-connected forward-biased semiconductor diodes. Depending on the diode used, a voltage drop of between 0.7 V and 2 V is established across each diode. The following holds true:

$$\phi_a'=\phi_a+n*U_F \text{ or } \phi_a'=\phi_a-n*U_F.$$

The source current $I_Q$ amounts to a few mA.

Figure 12:
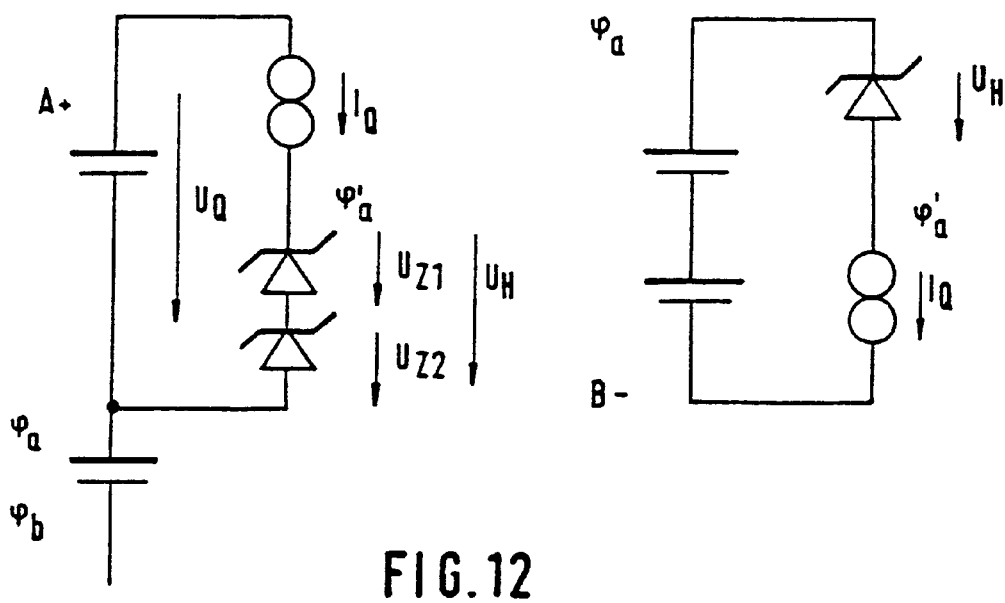

FIG. 12 shows an arrangement in which one or more series-connected reverse-biased zener diodes are provided as voltage shifting elements. These zener diodes each have zener voltages $U_{Zi}$ which may lie between 2 V and 100 V. The source current $I_Q$ amounts to a few mA.

Figure 13:
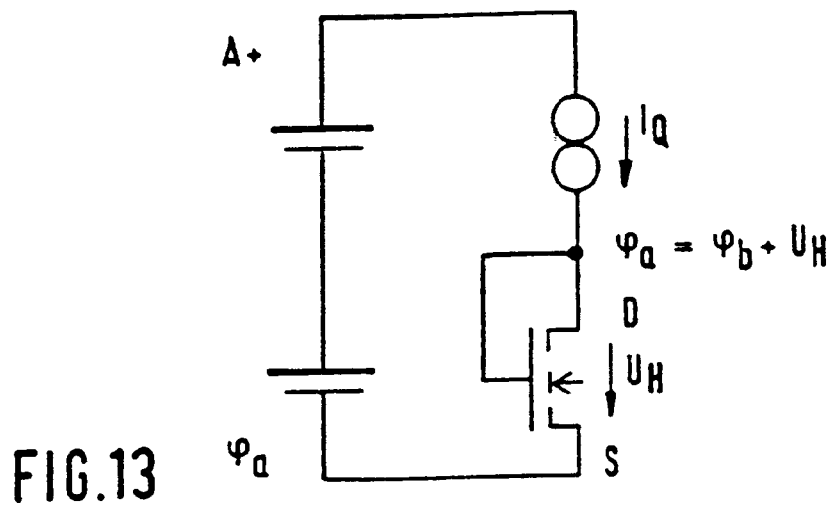

FIG. 13 shows an arrangement in which the potential shifting element is formed by a MOSFET in the diode operating mode. The threshold voltage $U_H$ of the MOSFET lies approximately between 0.1 V and 5 V. The following holds true:

$$\phi_a'=\phi_a+U_{TH}+\sqrt{(2*I_Q/\beta)}\approx\phi_a+U_{TH}$$

β is a transistor constant; the current $I_Q$ lies in the mA to μA range.

Figure 14:
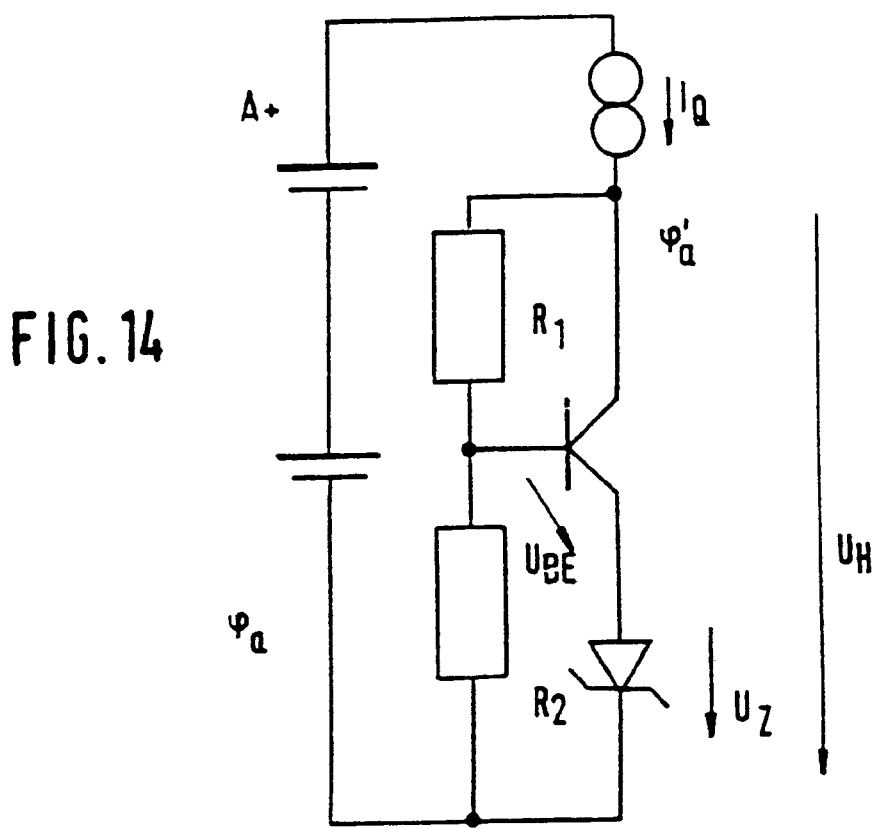

A further exemplary embodiment of a potential shifting element is shown in FIG. 14 with the so-called $U_{FO}$ multiplier circuit. In this case, the following holds true:

$$\phi_a'=\phi_a+(U_{BE}+U_Z)(1+R_1/R_2)$$

where $(U_{BE}+U_Z)(1+R_1/R_2)=UH.$

This circuit comprises a bipolar transistor with whose emitter a (reverse-biased) zener diode is connected in series. The resistor $R_1$ is connected in parallel between collector and base and the resistor $R_2$ is connected in parallel between base and reference point. In this case, the auxiliary voltage $U_H$ can be set by way of the resistance ratio $R_1$ to $R_2$.

It is also possible to achieve potential shifting by a combination of a plurality of the circuit possibilities mentioned above. The circuit parts relating to the potential shifting elements can also be of integrated design. It is possible, of course, to integrate the current sources/current sinks together with the potential shifting elements.

The foregoing disclosure has been set forth merely to ho illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A voltage measuring circuit for a composite fuel cell system, in which the potentials of a plurality of points within the composite fuel cell system are detected by tapping respective potentials of these points, comprising:
    a voltage evaluating device having a plurality of voltage measurement inputs;
    potential shifting elements coupled between respective inputs of said voltage evaluating device, and respective ones of the plurality of points of the composite fuel cell system; and
    a current sink or current source connected in series with the respective shifting elements,
    wherein potential shifting via the potential shifting element is based on potential of a respective point within the composite cell system relative to a reference point of the composite fuel cell system, with a proper state of the individual cells of the composite fuel cell system.

2. The voltage measuring circuit according to claim 1, wherein the potentials of two points whose potential is to be measured are shifted by the same magnitude via the respective potential shifting elements.

3. The voltage measuring circuit according to claim 1, wherein the circuit comprises at least one integrated circuit.

4. The voltage measuring circuit according to claim 1, wherein at least one voltage stabilization element is connected in parallel with the voltage measuring circuit, at least one current source or current sink being connected in series with this parallel circuit.

5. A method of measuring voltages at a plurality of points within which a composite fuel cell system, comprising:
    tapping potential at each of said plurality of points;
    shifting tapped potential values at each of said plurality of points by a predetermined amount;
    inputting shifted potential values to a voltage measurement device.

6. The method according to claim 5, wherein said shifting step is performed by means of a potential shifting element connected in series with a constant current device, between each of said plurality of points and respective inputs of said voltage measurement device.

7. The method according to claim 5, further comprising:
    determining a potential difference between a selected pair of said plurality of points by subtracting measured voltage values based on said shifted potential values.

8. The method according to claim 5, wherein the potentials of two points whose potential is to be measured are shifted by the same magnitude via respective potential shifting elements.

* * * * *